(12) United States Patent
Wang et al.

(10) Patent No.: US 12,717,399 B2
(45) Date of Patent: Aug. 25, 2026

(54) MICRO-APPLICATION PROCESSOR ARCHITECTURE

(71) Applicant: HUADA SEMICONDUCTOR CO., LTD., Shanghai (CN)

(72) Inventors: Xucheng Wang, San Diego, CA (US); Wei Xie, Shanghai (CN); Bin Liu, Shanghai (CN); Jingwei Xu, Plano, TX (US); Kai Qiao, Shanghai (CN); Wei Xu, Shanghai (CN); Jian He, Shanghai (CN); Dawei Li, Shanghai (CN); Yuxiao Gong, Shanghai (CN); Kebin Li, Shanghai (CN); Wei Wu, Shanghai (CN)

(73) Assignee: HUADA SEMICONDUCTOR CO., LTD., Shanghai (CN)

( * ) Notice: Subject to any disclaimer, the term of this patent is extended or adjusted under 35 U.S.C. 154(b) by 273 days.

(21) Appl. No.: 18/585,090

(22) Filed: Feb. 23, 2024

(65) Prior Publication Data

US 2024/0291398 A1 Aug. 29, 2024

(30) Foreign Application Priority Data

Feb. 23, 2023 (CN) ......................... 202310156084.7

(51) Int. Cl.

| | |
|---|---|
| ***H03M 1/12*** | (2006.01) |
| ***G06F 1/3296*** | (2019.01) |
| ***G06F 13/20*** | (2006.01) |
| *G06F 1/3234* | (2019.01) |
| *G06F 13/40* | (2006.01) |

(52) U.S. Cl.
CPC ............ *G06F 1/3296* (2013.01); *G06F 13/20* (2013.01); *G06F 1/3243* (2013.01); *G06F 13/4004* (2013.01); *H03M 1/12* (2013.01)

(58) Field of Classification Search
CPC ......... G06F 1/3296; G06F 13/20; H03M 1/12
See application file for complete search history.

(56) References Cited

U.S. PATENT DOCUMENTS 8,416,113 B1 * 4/2013 Vanitegem ............ H03M 1/004
341/161

* cited by examiner

*Primary Examiner* — Joseph J Lauture
(74) *Attorney, Agent, or Firm* — IPRTOP LLC

(57) ABSTRACT

A MAP architecture includes a low-voltage digital module, a low-voltage analog module, and one or more high-voltage analog modules. The low-voltage digital module is communicatively connected to the digital signal bus for implementing digital functions, the low-voltage analog module is communicatively connected to the low-voltage digital module and the digital signal bus for implementing low-voltage analog functions, and the high-voltage analog modules are communicatively connected to one or more of the low-voltage digital module, the digital signal bus, and the low-voltage analog module for implementing high-voltage analog functions. The present disclosed MAP architecture integrates low-voltage and high-voltage analog functions required for applications such as energy-saving power control. These functions include power input, mixed-signal processing, and load driving. The integration of these functions allows users to reduce the construction of peripheral hardware analog circuits as much as possible. It caters to universal requirements for digital control and associated analog circuits.

9 Claims, 1 Drawing Sheet

MICRO-APPLICATION PROCESSOR ARCHITECTURE

CROSS REFERENCE TO RELATED APPLICATION

The present application claims the benefit of priority to Chinese Patent Application No. 202310156084.7, entitled "MICRO-APPLICATION PROCESSOR ARCHITECTURE", filed with CNIPA on Feb. 23, 2023, the disclosure of which is incorporated herein by reference in its entirety for all purposes.

FIELD OF THE INVENTION

The present disclosure generally relates to the technical field of microcontroller units (MCUs) and in particular to a micro-application processor (MAP) architecture.

BACKGROUND OF THE INVENTION

There are primarily two types of control chip architectures in existence today. The first type is the traditional, general-purpose digital control chip. These chips have a limited number of integrated analog peripherals. Therefore, in practical applications, it's often necessary to construct a significant number of analog devices around the chip. The second type is the dedicated chip. These chips are typically designed for a single application and cannot be disassembled. While they are highly specialized, their flexibility is limited. They are primarily used in specific low-voltage fields and are not suitable for platformization due to their inherent constraints.

SUMMARY OF THE INVENTION

In light of the problems in the related technology, the present disclosure provides a MAP architecture, including:

- a low-voltage digital module, communicatively coupled to a digital signal bus and configured to implement digital functions;
- a low-voltage analog module, communicatively coupled to the low-voltage digital module and the digital signal bus, and configured to implement low-voltage analog functions; and
- one or more high-voltage analog modules, communicably connected to one or more of the low-voltage digital module, the digital signal bus, and the low-voltage analog module, and configured to implement high-voltage analog functions.

Further, the high-voltage analog modules are selectively communicatively connected to each other.

Further, the low-voltage digital module, the low-voltage analog module, and the high-voltage analog modules are respectively assembled using the same processes.

Further, the low-voltage digital module, the low-voltage analog module, and high-voltage analog modules are respectively assembled using different processes.

Further, the low-voltage digital module comprises one or more of a microprocessor core, a communication peripheral, a PWM peripheral, a direct memory access, and an analog-to-digital converter.

Further, each of the high-voltage analog modules comprises one or more of a power conversion module, a high-voltage gate-level driver module, a temperature sensor, and a low-dropout regulator.

Further, the low-voltage analog module comprises:

- an analog signal bus, connected to an output of an analog signal generation submodule;
- a comparator, wherein at least one first input of the comparator is connected to the analog signal bus, wherein the comparator is configured to select a first analog signal from the analog signal bus based on control or protection needs of the architecture, and to compare the first analog signal with a second analog signal selected from the analog signal bus or a preset threshold; and
- a digital signal bus, connected to an output of the comparator to transmit digital signals output from the comparator to respective modules or devices.

Further, a second input of the comparator isolated from the analog signal bus is connected to a digital-to-analog converter.

Further, an input of the digital-to-analog converter is connected to a ramp generator.

Further, the MAP architecture further includes a signal processing module connected to the comparator and configured to process input signals or output signals of the comparator.

Further, the analog signal generation submodule includes single-ended programmable amplifiers, differential programmable amplifiers, digital-to-analog converters, and external analog signal inputs.

Further, the control and/or protection functions include over-current protection, over-voltage protection, and peak current control.

In summary, the present disclosure introduces a MAP architecture. This architecture integrates analog functions required for applications such as energy-saving power control. These functions include power input, mixed-signal processing, and load driving. The integration of these functions allows users to reduce the construction of peripheral hardware analog circuits as much as possible. Simultaneously, it caters to the universal requirements of power control applications for digital control and associated analog circuits. This approach enhances the overall integration of the system. In addition, the architecture can be tailored according to the similarities and differences in the requirements for analog circuits within the power control system. By adding or removing differentiated functional modules under the basic architecture, platformization of the control architecture can be achieved. Furthermore, the analog and digital modules are designed to support integration within the same process, as well as System-in-Package (SIP) integration under different processes. This not only satisfies the requirements for universality, but also allows for quick customization based on customer needs, which aids customers in reducing the number of circuit components, minimizing losses, lowering costs, and enhancing system reliability, making the system more environmentally friendly and efficient.

BRIEF DESCRIPTION OF DRAWINGS

To further clarify the above and other advantages and features of the various embodiments of the present disclosure, reference will be made to the accompanying drawings to present a more specific description of the various embodiments of the present disclosure. It can be understood that these drawings only depict typical embodiments of the present disclosure and will not be considered as limiting its scope. In the drawings, for clarity, the same or corresponding parts will be indicated by the same or similar markings.

DETAILED DESCRIPTION

In the following description, the present disclosure is described with reference to the respective embodiments. However, those skilled in the art will appreciate that the various embodiments can be implemented without one or more specific details or in conjunction with other replacement or additional methods or components. In other cases, well-known structures or operations are not shown or described in detail to avoid obscuring the inventive aspects of the present disclosure. Similarly, for purposes of explanation, specific quantities and configurations are set forth in order to provide a comprehensive understanding of embodiments of the present disclosure. However, the present disclosure is not limited to these particular details. Furthermore, it should be understood that the embodiments illustrated in the accompanying drawings are illustrative and not necessarily drawn to the correct scale.

In the present disclosure, the reference to "an embodiment" or "the embodiment" means that a particular feature, structure, or characteristic described in connection with the embodiment is included in at least one embodiment of the present disclosure. The phrase "in an embodiment"/"in one embodiment" appearing throughout the present disclosure does not necessarily all refer to the same embodiment.

To enhance system integration by minimizing the need for peripheral hardware analog circuits, the present disclosure introduces a micro-application processor architecture. This architecture not only maintains the exceptional flexibility and configurability of traditional MCUs, but it also incorporates high-voltage analog functions. These include power conversion, power control, motor control, and other analog functions necessary for the system, which allows for the implementation of power input, mixed-signal processing, and load driving, among other features. In addition, the MAP architecture can be tailored according to the similarities and differences in the requirements for analog circuits. By adding or removing differentiated functional modules under the basic architecture, platformization of the control architecture can be achieved. That is, it can be used as a general-purpose chip for a variety of high-voltage applications. The scheme of the present disclosure is further described below in conjunction with the accompanying drawings of the embodiments.

Figure 1:
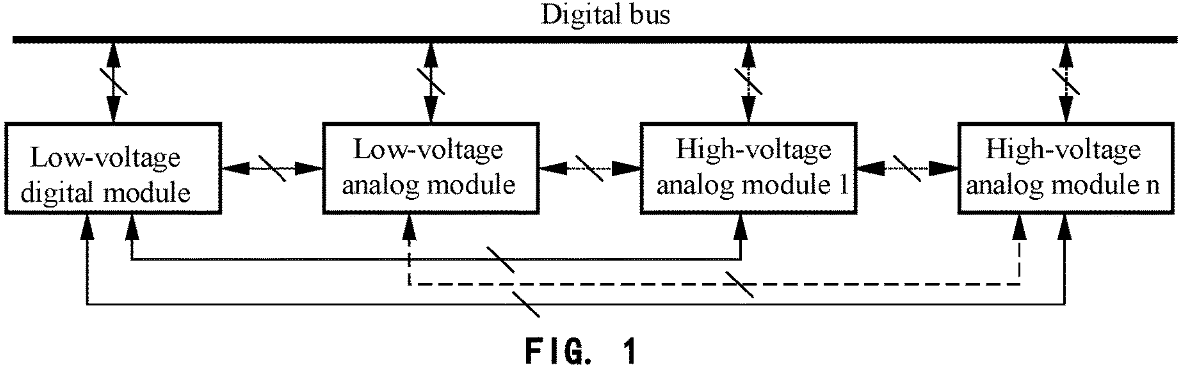
FIG. 1 illustrates a schematic structure of a MAP architecture according to an embodiment of the present disclosure.

FIG. 1 illustrates a schematic structure of a MAP architecture according to an embodiment of the present disclosure. As shown in FIG. 1, the MAP architecture includes a low-voltage digital module LV-digital, a low-voltage analog module LV-analog, and one or more high-voltage analog modules HV-analog. The communication relationship between the modules is shown in FIG. 1. The low-voltage digital module and low-voltage analog module are both connected to a digital bus, and there can be independent signal interactions between the two modules; the high-voltage analog modules may be connected to the digital bus, or they may have independent signal interactions with only the low-voltage digital module; there may be independent signal interactions between the low-voltage analog module and the high-voltage analog modules; the high-voltage analog modules can also have independent signal interactions with each other, i.e., the high-voltage analog modules are selectively communicatively connected to each other. Furthermore, the communication protocol of the digital bus is selected according to requirements of the system and the processor. According to the similarities and differences in the requirements for analog circuits in actual high-voltage applications, the low-voltage analog module can be configured to realize control and protection functions, and the high-voltage analog modules can also be added or removed to realize certain functions of high-voltage analog circuits, such as power conversion, low-dropout (LDO) regulator, and high-voltage gate-level driver, so as to platformize the control architecture.

As an example, the high-voltage analog modules are categorized based on their respective breakdown voltages; for example, a high-voltage analog module with a breakdown voltage of 150V is categorized as a first high-voltage analog module, and a high-voltage analog module with a breakdown voltage of 650V is categorized as a second high-voltage analog module. As an example, the high-voltage analog modules are categorized based on the respective functions they are required to implement, e.g., the one implementing a power supply circuit is categorized as a first high-voltage analog module, and the one implementing a driving circuit is categorized as a second high-voltage analog module. The criteria for categorizing the high-voltage analog modules may be decided according to the actual application.

In addition, in the embodiment of the present disclosure, the MAP architecture, as previously described, offers several application modes: 1) the low-voltage digital module can function independently as a standalone chip; 2) the low-voltage digital module and the low-voltage analog module can be integrated together to form a single chip; 3) the low-voltage digital module, the low-voltage analog module, and the high-voltage analog modules can be combined into one chip. The choice of application mode can be tailored to meet specific requirements.

Figure 2:
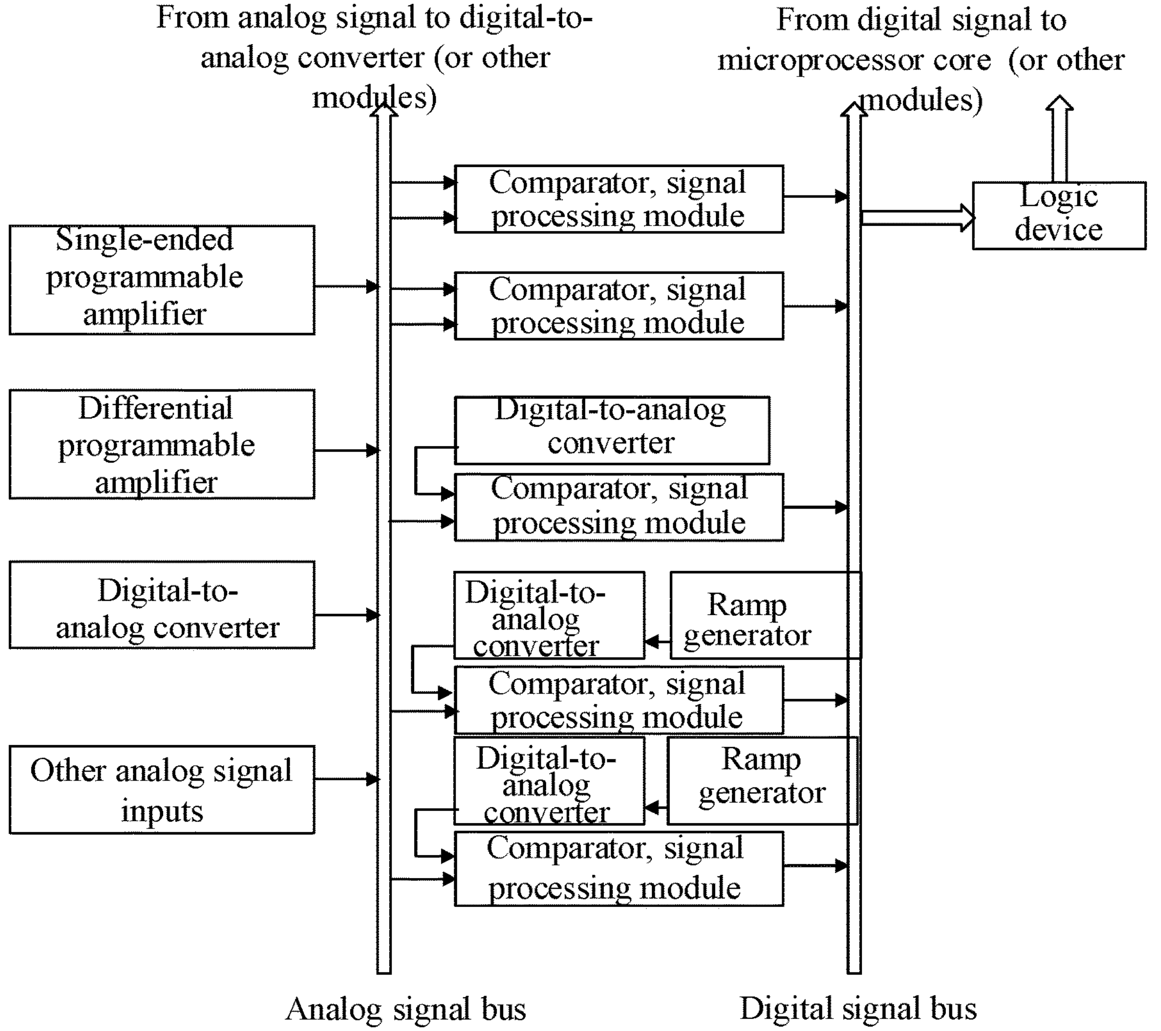
FIG. 2 illustrates a schematic diagram of an architecture of a low-voltage analog module according to an embodiment of the present disclosure.

FIG. 2 illustrates a schematic diagram of an architecture of the low-voltage analog module according to an embodiment of the present disclosure. The "low-voltage" in the term "low-voltage analog module" means that its operating voltage is lower than or equal to the power supply voltage of the control chip, and the term "low-voltage analog module" mainly refers to low-voltage analog circuit components required by the system, which may include a large number of analog front-end circuits, mixed-signal processing modules, and low-voltage power supply modules, and the like. As an example, the functions of the analog modules are not fixed. Instead, they can be flexibly configured to perform different functions. Ultimately, by working in conjunction with other functional modules and/or devices, they can meet various control and/or protection needs of the user, such as over-current protection, over-voltage protection, peak current control, etc. To achieve the above purpose, as an example, the analog modules adopt an architecture as shown in FIG. 2, but it should be understood that in other embodiments of the present disclosure, other architectures may be adopted and built according to the actual situation. It should be noted that, the micro-application processor architecture is a general-purpose chip aimed at high-voltage fields such as power control, energy conversion, and energy-saving applications. Therefore, its low-voltage analog module needs to integrate a universal signal chain that can communicate with various high-voltage analog modules.

As shown in FIG. 2, as an example, the low-voltage analog module includes an analog signal bus, a processing module, and a digital signal bus. The analog signal bus is connected to an output of at least one analog signal generation submodule, and analog signals output by the at least one analog signal generation submodule constitute the analog signal bus. As an example, the analog signal generation submodule includes x single-ended programmable amplifiers (SPGAs), y differential programmable amplifiers (DPGAs), z digital-to-analog converters (DACs), and other analog signal input modules, such as external analog signal inputs, etc., wherein x, y, z are integers greater than or equal to zero. The analog signal bus may transmit analog signals to an analog-to-digital converter (ADC) or other functional modules and devices.

The processing module of the low-voltage analog module includes at least one comparator, which has two inputs, and at least one input of each comparator is connected to the analog signal bus. Specifically, in a first exemplary configuration, both inputs of the comparator are connected to the analog signal bus, so that in practical application, two corresponding analog signals are selected from the analog signal bus for comparison according to the required control or protection functions of the system, thereby providing a basis for subsequent control or protection actions. In a second exemplary configuration, one input of the comparator is connected to the analog signal bus, and the other input of the comparator is connected to an output of a dedicated digital-to-analog converter, so that in practical application, one analog signal is selected from the analog signal bus according to the required control or protection functions of the system, and compared with a preset threshold value, thereby providing a basis for subsequent control or protection actions. It should be understood that in different embodiments of the present disclosure, the number of comparators included may vary; the comparators may have all their inputs configured according to the first configuration, or the comparators may have all their inputs configured according to the second configuration; preferably, some of the comparators have their inputs configured according to the first configuration, and some of the comparators have their inputs configured according to the second configuration. Furthermore, as an example, a ramp generator is further connected to an input of the dedicated digital-to-analog converter to smooth signals received by the latter. Therefore, the inputs of the comparators can be flexibly configured according to actual demands, thus realizing different control or protection functions. For example, for a certain comparator, one of its inputs receives a voltage measurement value of a certain functional module, and the other input receives a preset voltage threshold, and then over-voltage protection can be realized by comparing the voltage measurement value of the functional module with the preset voltage threshold, and outputting a corresponding control signal to cut off the circuit when the voltage measurement value exceeds the threshold, wherein the voltage measurement value is obtained from the analog signal bus, and the preset voltage threshold is obtained through the dedicated digital-to-analog converter. For example, one input of the comparator receives a current measurement value of a certain functional module or device, and the other input receives a preset current threshold, and then over-current protection can be realized by comparing the current measurement value of the functional module or device with the preset current threshold, and outputting a corresponding control signal to activate a protection device when the current measurement value exceeds the threshold, wherein the current measurement value is obtained from the analog signal bus, and the preset current threshold is output through the dedicated digital-to-analog converter.

In order to better realize signal comparison, as an example, a signal processing module may also be connected to an input or output of the comparator to process the input or output signals of the comparator by, for example, removing glitches, taking inversions, or forcing outputs.

Digital signals output by the comparator and its signal processing module constitute the digital signal bus, and the digital signal bus may transmit digital signals to an MCU core or other functional modules, devices and the like. The MCU core or other functional modules and devices may carry out corresponding actions according to the respective digital signals that they receive.

Furthermore, in order to realize communication with other digital modules or digital buses, as an example, the low-voltage analog module further comprises an ADC.

As an example, the low-voltage digital module includes the digital part of a conventional controller, such as an MCU core, communication peripherals, pulse-width modulation (PWM) peripherals, Direct Memory Access (DMA) and the like. As an example, the ADC is included in the low-voltage digital module in order to enable communication between the low-voltage digital module and analog modules.

As an example, the high voltage of the high-voltage analog modules is relative to the supply voltage of the MCU. Each high-voltage analog module includes, but is not limited to, a configurable power conversion module, a low-dropout (LDO) regulator, a high-voltage gate-level driver module, and the like. The specific structure of the high-voltage analog modules may be decided according to the system requirements and technical constraints; as an example, when applying the control chip to a typical motor system, each high-voltage analog circuit module may include, but is not limited to, two DC/DC buck converters and two LDOs to provide power supply for LV-digital and LV-analog, a three-phase gate-level pre-driver, and a temperature sensor.

The MAP architecture is highly flexible and suitable for platformization. Depending on the degree of technological development, the low-voltage digital module, low-voltage analog module, and high-voltage analog modules may be respectively assembled using the same process, or they may be respectively assembled using different processes before being integrated to form an SIP structure, i.e., heterogeneous integration of the individual modules may be realized. This not only satisfies the requirements for universality, but also allows for quick customization based on customer needs, which aids customers in reducing the number of circuit components, minimizing losses, lowering costs, and enhancing system reliability, making the system more environmentally friendly and efficient.

Embodiments described above are exemplary instead of restrictive of the present disclosure. It will be apparent to those skilled in the relevant field that various combinations, variations and changes can be made to the embodiments without departing from the spirit and scope of the present disclosure. Accordingly, the scope of the present disclosure should not be limited by the exemplary embodiments disclosed above.

The invention claimed is:

1. A micro-application processor (MAP) architecture, comprising:

a low-voltage digital module, communicatively coupled to a digital signal bus and configured to implement digital functions, wherein the low-voltage digital module comprises one or more of a microprocessor core, a communication peripheral, a PWM peripheral, a direct memory access, and an analog-to-digital converter;

a low-voltage analog module, communicatively coupled to the low-voltage digital module and the digital signal bus, and configured to implement low-voltage analog functions; and high-voltage analog modules, communicably connected to one or more of the low-voltage digital module, the digital signal bus, and the low-voltage analog module, and configured to implement high-voltage analog functions.

2. The MAP architecture according to claim 1, wherein the high-voltage analog modules are selectively communicatively connected to each other.

3. The MAP architecture according to claim 1, wherein the low-voltage digital module, the low-voltage analog module, and the high-voltage analog modules are respectively assembled using the same processes.

4. The MAP architecture according to claim 1, wherein the low-voltage digital module, the low-voltage analog module, and high-voltage analog modules are respectively assembled using different processes.

5. The MAP architecture according to claim 1, wherein each of the high-voltage analog modules comprises one or more of a power conversion module, a high-voltage gate-level driver module, a temperature sensor, and a low-dropout regulator.

6. The MAP architecture according to claim 1, wherein the low-voltage analog module comprises:

an analog signal bus, connected to an output of an analog signal generation submodule;

a comparator, wherein at least one first input of the comparator is connected to the analog signal bus, wherein the comparator is configured to select a first analog signal from the analog signal bus based on control or protection needs of the architecture, and to compare the first analog signal with a second analog signal selected from the analog signal bus or a preset threshold; and a digital signal bus, connected to an output of the comparator to transmit digital signals output from the comparator to respective modules or devices.

7. The MAP architecture according to claim 6, wherein a second input of the comparator isolated from the analog signal bus is connected to a digital-to-analog converter.

8. The MAP architecture according to claim 7, wherein an input of the digital-to-analog converter is connected to a ramp generator.

9. The MAP architecture according to claim 6, further comprising a signal processing module connected to the comparator and configured to process input signals or output signals of the comparator.

* * * * *